US009663397B2

(12) United States Patent
Okamoto et al.

(10) Patent No.: US 9,663,397 B2
(45) Date of Patent: May 30, 2017

(54) BROADBAND EMISSION MATERIAL AND WHITE LIGHT EMISSION MATERIAL

(71) Applicant: Central Glass Company, Limited, Ube-shi, Yamaguchi (JP)

(72) Inventors: Hideyuki Okamoto, Matsusaka (JP); Ken Kasuga, Matsusaka (JP)

(73) Assignee: Central Glass Company, Limited, Ube-shi (JP)

( * ) Notice: Subject to any disclaimer, the term of this patent is extended or adjusted under 35 U.S.C. 154(b) by 0 days.

(21) Appl. No.: 14/892,917

(22) PCT Filed: Apr. 25, 2014

(86) PCT No.: PCT/JP2014/061675
§ 371 (c)(1),
(2) Date: Nov. 20, 2015

(87) PCT Pub. No.: WO2014/188847
PCT Pub. Date: Nov. 27, 2014

(65) Prior Publication Data
US 2016/0090322 A1     Mar. 31, 2016

(30) Foreign Application Priority Data

May 21, 2013 (JP) .................................. 2013-107029
Jul. 30, 2013  (JP) .................................. 2013-157227

(51) Int. Cl.
C03C 3/32    (2006.01)
C03C 4/12    (2006.01)
(Continued)

(52) U.S. Cl.
CPC .............. *C03C 3/325* (2013.01); *C03C 3/247* (2013.01); *C03C 4/12* (2013.01); *C09K 11/7774* (2013.01);
(Continued)

(58) Field of Classification Search
CPC .. C03C 3/325; C03C 4/12; H01S 3/173; H01S 3/1618; H01S 3/1631
See application file for complete search history.

(56) References Cited

U.S. PATENT DOCUMENTS 4,328,318 A * 5/1982 Miranday ................ C03C 1/10
                                                    252/301.4 F
5,351,335 A * 9/1994 Ohishi .................. C03C 4/0071
                                                    359/343
(Continued)

FOREIGN PATENT DOCUMENTS

EP    1 085 256 A1     3/2001
JP    11-302638 A      11/1999
(Continued)

OTHER PUBLICATIONS

Okamoto et al. "White emission of Yb2+:fluoride glasses efficiently excited with near-UV light", Optics Express vol. 21, No. 19, pp. 22043-22052, (Sep. 23, 2013).*
(Continued)

*Primary Examiner* — Eric Bolda
(74) *Attorney, Agent, or Firm* — Crowell & Moring LLP

(57) ABSTRACT

A broadband emission material according to the present invention includes: a fluoride glass containing 20 to 45 mol % of $AlF_3$, 25 to 63 mol % of alkaline-earth fluorides in total and 3 to 25 mol % of at least one fluoride of element selected from the group consisting of Y, La, Gd and Lu; and ytterbium ions incorporated in the fluoride glass as divalent rare-earth ions so as to serve as a luminescent center, wherein the fluoride glass includes 1 to 15 mol % of at least one halide of element selected from the group consisting of Al, Ba, Sr, Ca and Mg and element selected from the group consisting of Cl, Br and I; and wherein the alkaline-earth
(Continued)

fluorides includes 0 to 15 mol % of $MgF_2$, 7 to 25 mol % of $CaF_2$, 0 to 22 mol % of $SrF_2$ and 0 to 5 mol % of $BaF_2$.

19 Claims, 4 Drawing Sheets

(51) Int. Cl.
 H01S 3/17 (2006.01)
 H01S 3/16 (2006.01)
 C09K 11/77 (2006.01)
 C03C 3/247 (2006.01)
 F21V 8/00 (2006.01)
 H01S 3/091 (2006.01)
 H01L 33/50 (2010.01)

(52) U.S. Cl.
 CPC ........ *C09K 11/7779* (2013.01); *G02B 6/0003* (2013.01); *H01S 3/091* (2013.01); *H01S 3/173* (2013.01); *H01L 33/501* (2013.01); *H01L 33/502* (2013.01); *H01S 3/1618* (2013.01); *H01S 3/1631* (2013.01); *Y02B 20/181* (2013.01)

(56) References Cited

U.S. PATENT DOCUMENTS

| | | | |
|---|---|---|---|
| 5,755,998 | A | 5/1998 | Yamazaki et al. |
| 5,998,925 | A | 12/1999 | Shimizu et al. |
| 6,069,440 | A | 5/2000 | Shimizu et al. |
| 6,614,179 | B1 | 9/2003 | Shimizu et al. |
| 2004/0000868 | A1 | 1/2004 | Shimizu et al. |
| 2004/0004437 | A1 | 1/2004 | Shimizu et al. |
| 2004/0090180 | A1 | 5/2004 | Shimizu et al. |
| 2004/0222435 | A1 | 11/2004 | Shimizu et al. |
| 2005/0280357 | A1 | 12/2005 | Shimizu et al. |
| 2006/0081814 | A1 | 4/2006 | Shida et al. |
| 2007/0114914 | A1 | 5/2007 | Shimizu et al. |
| 2007/0159060 | A1 | 7/2007 | Shimizu et al. |
| 2007/0272898 | A1* | 11/2007 | Yoshikawa ........ C09K 11/7719 252/301.4 H |
| 2008/0138918 | A1 | 6/2008 | Shimizu et al. |
| 2008/0251765 | A1 | 10/2008 | Shida et al. |
| 2008/0283797 | A1 | 11/2008 | Shida et al. |
| 2009/0285995 | A1 | 11/2009 | Shida et al. |
| 2009/0315014 | A1 | 12/2009 | Shimizu et al. |
| 2009/0315015 | A1 | 12/2009 | Shimizu et al. |
| 2009/0316068 | A1 | 12/2009 | Shimizu et al. |
| 2010/0001258 | A1 | 1/2010 | Shimizu et al. |
| 2010/0001631 | A1 | 1/2010 | Gotoh et al. |
| 2010/0006819 | A1 | 1/2010 | Shimizu et al. |
| 2010/0019224 | A1 | 1/2010 | Shimizu et al. |
| 2010/0019270 | A1 | 1/2010 | Shimizu et al. |
| 2010/0117516 | A1 | 5/2010 | Shimizu et al. |
| 2010/0264841 | A1 | 10/2010 | Shimizu et al. |
| 2010/0264842 | A1 | 10/2010 | Shimizu et al. |
| 2011/0053299 | A1 | 3/2011 | Shimieu et al. |
| 2011/0062864 | A1 | 3/2011 | Shimizu et al. |
| 2011/0297990 | A1 | 12/2011 | Shimizu et al. |
| 2014/0084323 | A1 | 3/2014 | Shimizu et al. |

FOREIGN PATENT DOCUMENTS

| | | |
|---|---|---|
| JP | 2000-208815 A | 7/2000 |
| JP | 2001-135116 A | 5/2001 |
| JP | 3700502 B2 | 9/2005 |
| JP | 2006-111829 A | 4/2006 |
| JP | 3961585 B2 | 8/2007 |
| JP | 2007-335495 A | 12/2007 |
| JP | 2008-88257 A | 4/2008 |
| JP | 2008-177484 A | 7/2008 |
| JP | 2008-201610 A | 9/2008 |
| WO | WO 2008/102488 A1 | 8/2008 |

OTHER PUBLICATIONS

International Search Report (PCT/ISA/210) issued in PCT Application No. PCT/JP2014/061675, dated Aug. 5, 2014, with English translation (six (6) pages).
Naruhito Sawanobori, "Development of Fluorescent Glass", Material Integration, vol. 17, No. 3, 2004, with English abstract (seven (7) pages).
M. Poulain et al., "Chemistry of fluoride glasses", Chemtronics, vol. 3, No. 2, 1988, pp. 77-85.
J. W. M. Verwey et al., "The Luminescence of Divalent and Trivalent Rare Earth Ions in Syam-Fluoride Glass", Journal of Physics and Chemistry of Solids, vol. 53, No. 9, 1992, pp. 1157-1162.
Lihong Liu et al., Photoluminescence properties of β-SiAlON : $Yb^{2+}$, a novel green-emitting phosphor for white light-emitting diodes >>, Science and Technology of Advanced Materials, vol. 12, 2011 (seven (7) pages).
Korean-language Office Action issued in counterpart Korean Application No. 10-2015-7034851 dated Nov. 29, 2016 (Six (6) pages).
Qihua, Y., et al., "The Formation and Characteristic of Fluoride Glasses in the System $AlF_3$—$LnF_3$—$MeF_2$", Journal of Silicate, Feb. 1990, vol. 18, No. 3, pp. 16-26 with English abstract (Eleven (11) pages).
Chinese-language Office Action issued in counterpart Chinese Application No. 201480029472.8 dated Nov. 14, 2016 (Eight (8) pages).

\* cited by examiner

BROADBAND EMISSION MATERIAL AND WHITE LIGHT EMISSION MATERIAL

FIELD OF THE INVENTION

The present invention relates to a broadband emission material capable of emitting light over a broad band and a white light emission material using the broadband emission material.

BACKGROUND ART

In recent years, white LED devices have been put into use as illumination light sources in place of filament lamps. For such use, there is a demand to provide white LED devices with power saving performance and high color-rendering properties. Many of currently available white LED devices realize pseudo white light by combination of YAG-Ce yellow phosphors and GaN blue LEDs.

However, the conventional combination of YAG-Ce yellow phosphors and blue LEDs faces the problem that cyan component light (up to 500 nm) and red component light (600 nm or more) are not sufficient. It is thus common practice to supplement these insufficient component lights by mixing a plurality of phosphors. For example, Patent Document 1 discloses a high-color-rendering white light source using a YAG-Ce yellow phosphor in combination of a red-emitting Eu complex.

On the other hand, there occur large variations in emission color between white light emitting devices as discussed in Patent Document 2 in the case where the white light emitting devices are produced to achieve high color-rendering properties by mixing a plurality of phosphors as mentioned above. Even when the white light emitting devices are each produced with a plurality of phosphors, it is difficult for the white light emitting devices to achieve high color-rendering properties due to very low emission intensity at wavelengths midway between the center emission wavelengths of the respective phosphors. The conventional combination of YAG-Ce yellow phosphors and blue LEDs also has the problem that the use of a part of blue excitation light as illumination light leads to variations in the color of the illumination light depending on the thickness of the phosphor layer through which the blue light passes (Patent Document 3) even though it is advantageous in terms of a small strokes shift and high emission efficiency by a small difference between excitation wavelength (about 450 nm) and fluorescence wavelength (center wavelength: about 550 nm; wavelength shift depending on the amounts of Gd and Y added). It has been suggested that, in the white light emitting device where the yellow phosphor layer is mounted on the blue LED element, the color of the illumination light varies between the center and periphery of the element.

There are known materials each capable of emitting white light by itself, such as a fluoride glass containing divalent ytterbium ions ($Yb^{2+}$) (Patent Document 4) and fluorophosphate salt glasses containing blue fluorescent divalent europium ions ($Eu^{2+}$) and phosphorus (P) (Patent Document 5 and Non-Patent Document 1).

Furthermore, Patent Document 4 proposes a white light emission material that uses: a fluoride glass containing 20 to 45 mol % of $AlF_3$; 40 to 65 mol % alkaline-earth fluorides in total, including 0 to 15 mol % of $MgF_2$, 7 to 25 mol % of $CaF_2$, 0 to 15 mol % of $SrF_2$ and 5 to 25 mol % of $BaF_2$ and 10 to 25 mol % of at least one fluoride of element selected from the group consisting of Y, La, Gd and Lu; and $Yb^2$ incorporated as a luminescent center in the fluoride glass.

PRIOR ART DOCUMENTS

Patent Documents

Patent Document 1: Japanese Laid-Open Patent Publication No. 2001-135116
Patent Document 2: Japanese Laid-Open Patent Publication No. 2007-335495
Patent Document 3: Japanese Laid-Open Patent Publication No. 2008-88257
Patent Document 4: Japanese Laid-Open Patent Publication No. 2008-201610
Patent Document 5: Japanese Patent No. 3961585
Patent Document 6: Japanese Patent No. 3700502

Non-Patent Documents

Non-Patent Document 1: Naruhito SAWANOBORI, Development of Fluorescent Glass, Material Integration, Vol. 17, No. 3 (2004)
Non-Patent Document 2: M. Poulain et al., Chemtronics, Vol. 3, No. 2, pp. 77-85, 1988
Non-Patent Document 3: J. W. M Verwey et al., Journal of Physics and Chemistry of Solids, Volume 53, Issue 9, September 1992, pp. 1157-1162
Non-Patent Document 4: Lihong Liu et al., "Photoluminescence Properties of $\beta$-SiAlON:$Si^{2+}$, A Novel Green-Emitting Phosphor for White-Emitting Diodes", Sci. Techol. Adv. Mater., 12, 034404

SUMMARY OF THE INVENTION

Problems to be Solved by Invention

As mentioned above, the conventional combination of YAG-Ce yellow phosphors and blue LEDs has the problem that cyan component light and red component light are not sufficient. In the case of using a plurality of phosphors to supplement these insufficient component lights, it is difficult to achieve the high color-rendering properties of the white light emitting devices due to very low emission intensity at wavelengths midway between the center emission wavelengths of the respective phosphors.

In order to attain white emission of $Yb^{2+}$ in the fluoride glass, the fluoride glass is produced by melting a raw glass material in a reduced atmosphere (Non-Patent Documents 2 and 3). However, the difficulty of vitrifying such a glass composition result in a need to pour the glass melt into a metal mold and rapidly cool the glass melt for the production of the glass or a problem of gray coloring of the glass. Namely, there is a restriction, on the selectable glass composition in the case of performing the reduction of the rare-earth element in the fluoride glass. It has thus been difficult to increase the white light emission efficiency of $Yb^{2+}$ ions in the fluoride glass.

Although it is described in Patent Document 5 that a fluorophosphate salt glass containing $Eu^{2+}$, terbium, samarium or manganese etc. shows white fluorescence, this white fluorescence is pseudo white light generated by mixing blue emission of $Eu^{2+}$, green emission of terbium and red emission of samarium or manganese and is not in the form of a continuous spectrum as in the case of sunlight so that, under this white fluorescence, objects may be seen in different colors from those under sunlight.

In view of the foregoing, it is an object of the present invention to provide a light emission material usable for a high-color-rendering white light source.

Means for Solving the Problems

As a result of extensive researches, the present inventors have found that: it is possible by adding a halide except fluoride to a specific fluoride glass to increase the emission intensity of $Yb^{2+}$ over a broad band. The use of such a fluoride glass composition allows an increase of emission intensity over a broad band so as to, when a phosphor is added, supplement a low-emission-intensity wavelength range of the phosphor and provide a white light emission material with higher color-rendering properties than conventional white light emission materials. The present inventors have made further researches on the basis of the above finding and found that, by decreasing the barium content of the fluoride glass composition, it is possible to utilize the fluoride glass composition as a white light emission material even without the addition of the other phosphor.

In other words, the present invention provides a broadband emission material comprising: a fluoride glass containing 20 to 15 mol % of $AlF_3$, 25 to 63 mol % of alkaline-earth fluorides in total and 3 to 25 mol % of at least one fluoride of element selected from the group consisting of Y, La, Gd and Lu; and ytterbium ions incorporated in the fluoride glass as divalent rare-earth ions so as to serve as a luminescent center, wherein the fluoride glass further contains 1 to 15 mol % of at least one halide of element selected from the group consisting of Al, Ba, Sr, Ca and Mg and element selected from the group consisting of Cl, Br and I; and wherein the alkaline-earth fluorides includes 0 to 15 mol % of $MgF_2$, 7 to 25 mol % of $CaF_2$, 0 to 22 mol % of $SrF_2$ and 0 to 5 mol % of $BaF_2$.

The ytterbium ions as the divalent rare-earth ions can be Obtained by adding a Yb compound such as $YbF_3$ or $YbCl_3$ to a raw glass material, melting the glass material in a reduced atmosphere and thereby reducing the Yb compound to $Yb^{2+}$. At this time, any of the Yb compound that has not been reduced to $Yb^2$ remains in the glass composition.

It is herein noted that, in the present invention, the term "broadband" refers to a wavelength range of visually recognizable light, such as e.g. about 380 to 700 nm.

The present invention also provides a white light emission material comprising the broadband emission material, wherein the total amount of Ba cations contained in the fluoride glass is 0 to 5 mol %.

The emission material of the present invention is usable for a high-color-rendering white light source. By the addition of a phosphor to the emission material of the present invention, it is possible to provide a white light emission material higher in emission intensity. It is also possible by optimizing the fluoride glass composition of the emission material to provide a white light emission material usable for a white light source even without the use of a plurality of phosphors.

DETAILED DESCRIPTION OF THE EMBODIMENTS

Figure 1:
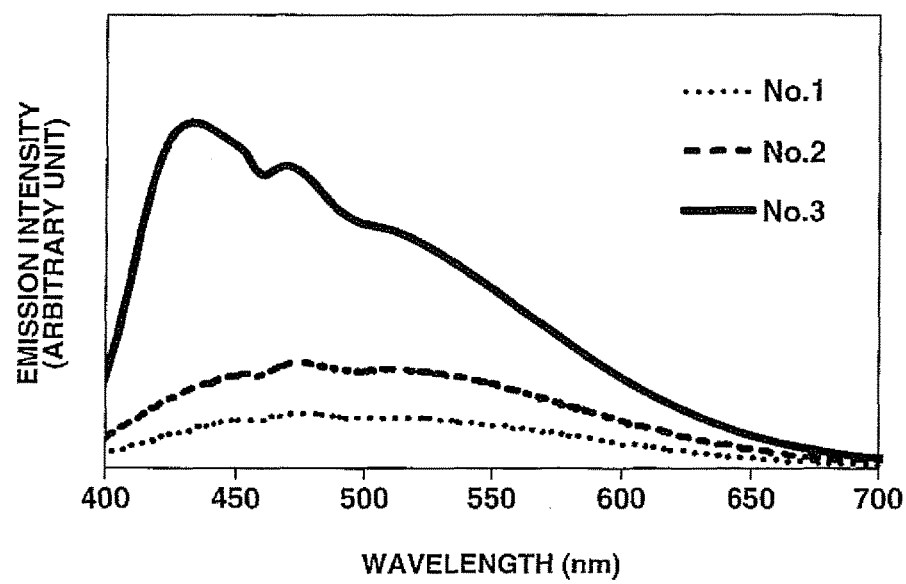
FIG. 1 is a diagram showing emission spectra of samples No. 1 to No. 3 as measured at an excitation wavelength of 365 nm.

The broadband emission material of the present invention includes: a fluoride glass containing 20 to 45 mol % of $AlF_3$, 25 to 63 mol % of alkaline-earth fluorides in total and 3 to 25 mol % of at least one fluoride of element selected from the group consisting of Y, La, Gd and Lu; and ytterbium ions incorporated in the fluoride glass as divalent rare-earth ions so as to serve as a luminescent center, wherein the fluoride glass further contains 1 to 15 mol % of at least one halide of element selected from the group consisting of Al, Ba, Sr, Ca and Mg and element selected from the group consisting of Cl, Br and I; and wherein the alkaline-earth fluorides includes 0 to 15 mol % of $MgF_2$, 7 to 25 mol % of $CaF_2$, 0 to 22 mol % of $SrF_2$ and 0 to 5 mol % of $BaF_2$.

In the present invention, $AlF_3$ is contained in an amount of 20 to 45 mol % as a glass forming component of the fluoride glass. The glass becomes difficult to vitrify when the amount of $AlF_3$ in the fluoride glass is less than 20 mol % or exceeds 45 mol %. The amount of $AlF_3$ in the fluoride glass is preferably in the range of 30 to 40 mol %.

The alkaline-earth fluorides are contained in a total amount of 25 to 63 mol % as glass forming components of the fluoride glass as in the case of $AlF_3$, The glass may become easy to crystallize when the amount of the alkaline-earth fluorides in the fluoride glass is less than 25 mol % or exceeds 63 mol %. The total amount of the alkaline-earth fluorides in the fluoride glass is preferably in the range of 32 to 48 mol %.

Further, the alkaline-earth fluorides includes 0 to 15 mol % of $MgF_2$, 7 to 25 mol % of $CaF_2$, 0 to 22 mol % of $SrF_2$ and 0 to 5 mol % of $BaF_2$ as mentioned above. The emission color of the emission material varies depending on the balance of these alkaline-earth fluoride components. It is preferable that: the amount of $MgF_2$ is 5 to 12 mol %; the amount of $CaF_2$ is 10 to 20 mol %; the amount of $SrF_2$ is 5 to 14 mol %; and the amount of $BaF_2$ is 0 to 5 mol %. As mentioned above, the emission material is usable as a white light emission material when the Ba content of the emission material is low In this case, the amount of $BaF_2$ is preferably in the range of 0 to 2 mol %.

The at least one fluoride of element selected from the group consisting of Y, La, Gd and Lu is also contained in an amount of 3 to 25 mol % as a glass forming component of the fluoride glass. As the fluoride glass is potentially difficult to vitrify, it is common practice to produce the fluoride glass by e.g. rapid cooling of glass melt. However, the glass may not be obtained in suitable form by such operation when the amount of the at least one fluoride of element selected from Y, La, Gd and Lu is less than 3 mol % or exceeds 25 mol %.

The amount of the at least one fluoride of element selected from Y, La, Gd and Lu in the fluoride glass is preferably in the range of 10 to 20 mol %.

The at least one halide of element selected from the group consisting of Al, Ba, Sr, Ca and Mg and element selected from the group consisting of Cl, Br and I is contained in an amount of 1 to 15 mol % in the fluoride glass. There cannot be obtained a remarkable increase of emission intensity when the total amount of this halide in the fluoride glass is less than 1 mol %. The fluoride glass becomes easy to crystallize when the total amount of this halide in the fluoride glass exceeds 15 mol %. The total amount of this halide in the fluoride glass is preferably in the range of 1 to 12 mol %. In order to reduce the tendency of crystallization of the fluoride glass and increase the fluorescence intensity of the emission material, it is particularly preferable to use either of $SrCl_2$, $CaCl_2$ and $MgCl_2$, each of which is not extremely low in melting point and is meltable at a melting temperature of the fluoride glass, i.e., 800 to 1200° C.

In the present invention, it is preferable that the amount of a phosphorus compound in the fluoride glass is 1 mol % or less. The present inventors have found as a result of extensive researches that ytterbium, which is generally present in a trivalent state, becomes resistance to reduction in the coexistence of a large amount of the phosphorus compound. For example, the emission intensity of the emission material is decreased to 50% or lower when $P_2O_5$ is contained in an amount exceeding 1 mol % in the glass composition. In other words, it is impossible for the fluorophosphate salt glasses of Patent Document 5 and Non-Patent Document 1 to attain white emission of $Yb^{2+}$ at high efficiency. In contrast to $P_2O_5$, there does not occur a significant decrease of emission intensity even when a slight amount of oxygen is mixed into the fluoride glass composition. The atmospheric gas and raw glass material compounds during the production of the fluoride glass are conceivable as a mixing route of oxygen. It is thus preferable that the fluoride glass is substantially free of the phosphorus compound. More preferably, the amount of the phosphorus compound in the fluoride glass is 0.5 mol % or less.

Further, the broadband emission material of the present invention is preferably capable of emitting fluorescence by excitation at a wavelength of 190 nm to 450 nm. When the wavelength of the excitation light is shorter than 190 nm, the excitation light cannot be propagated through the air. In addition, the wavelength of the excitation light becomes close to the shorter-wavelength-side absorption edge of the fluoride glass base matrix so that the base matrix tends to be damaged by the excitation light. When the wavelength of the excitation light exceeds 450 nm, the absorption coefficient of Yb becomes excessively low so that it is difficult to efficiently excite the emission material. It is particularly preferable that the emission material is capable of being excited in a wavelength range of 320 to 410 nm in terms of the availability of the excitation light source, the high absorption coefficient of $Yb^{2+}$ and the increase of the excitation spectrum by the addition of the halide except fluoride.

The amount of the ytterbium ions used as the divalent rare-earth luminescent center ions is preferably in the range of 0.1 to 5000 wt ppm. In a low $Yb^{2+}$ concentration less than the above preferable range, the emission material becomes low in absorption coefficient and thus may not be practical. In a high $Yb^2$ concentration range exceeding 5000 wt ppm, the emission material may not only cause concentration quenching, but also become so high in absorption coefficient as to emit light in a state of nearly surface emission and thus may not be suitable for uniform light emission.

The ytterbium ions can be obtained by adding a Yb compound such as $YbF_3$ or $YbCl_3$ to the raw glass material and melting the glass material in a reduced atmosphere. At this time, the amount of the Yb compound added to the raw glass material is set as appropriate. For example, it is feasible to control the $Yb^{2+}$ concentration to the above concentration range after the reduction of the Yb compound by adding 0.01 to 1.0 mol % of the Yb compound. In order to promote the reduction of the Yb compound, metal such as Al may be added in an amount of 0.1 mol % or less.

As mentioned above, the broadband emission material can be produced by mixing the raw compounds for the fluoride glass with the raw compound for the ytterbium ions, and then, melting the resulting raw glass material in a reduced atmosphere. It is feasible to melt the glass material by any suitable heating means such as heating by an electric furnace, heating by a laser beam or microwave, heating by convergence of light from an infrared lamp.

The broadband emission material of the present invention can suitably be used as a white light emission material when a phosphor having a luminescent center wavelength of 550 nm to 650 nm is incorporated in the fluoride glass.

As the phosphor, there can be used any appropriate phosphor suitable for use in a white light source. For example, it is feasible to add Mn, Sm, Pr etc. as a cation to the raw glass material. Examples of the phosphor are: SiALON phosphor (such as $Sr_2Si_7Al_3ON_{13}:Eu^{2+}$), CASN phosphor (such as $CaAlSiN_3:Eu^{2+}$), $K_2SiF_6:Mn^{4+}$, $La_2O_2S:Eu^{2+}$ and the like.

Each of $Mn^{2+}$, $Mn^{4+}$, $Sm^{2+}$ and $Pr^{3+}$ shows emission over orange to red wavelength ranges. The broad emission material can be thus produced as a high color-rendering white light emission material by adding such a phosphor to the above-mentioned raw material for the broadband emission material and melting the resulting raw glass material. Namely, it is preferable in the present invention that 0.01 to 2 mol % of at least one halide of element selected from the group consisting of Mn, Sm and Pr is incorporated in the fluoride glass for use of the broadband emission material as a white light emission material. When the total amount of this halide in the fluoride glass is less than 0.01 mol %, there may not be obtained a sufficient increase of red component light. In addition, the addition of such a small amount of the halide can readily result in a large measurement error and thereby lead to poor reproductivity. When the total amount of this halide in the fluoride glass exceeds 2 mol %, there may occur a crystalline deposit containing the halide. In order to produce the white light emission material with good reproductivity, the total amount of this halide in the fluoride glass is preferably in the range of 0.03 to 1 mol %.

For increase of red component light, it is feasible to use the at least one halide of an element selected from Mn, Sm and Pr in combination with the above-mentioned phosphor whose luminescent center wavelength ranges from 550 nm to 650 nm It is one preferred embodiment of the present invention to utilize the broadband emission material as a white light emission material by controlling the total amount of Ba cations in the fluoride glass to within the range of 0 to 5 mol %. When the total amount of Ba cations in the fluoride glass is the range of 0 to 5 mol %, the broadband emission material is capable of emitting white light, without the add of the other phosphor as mentioned above, and thus can suitably be used as the white light emission material. In this preferred embodiment, the total amount of Ba cations in the fluoride glass is preferably less than 5 mol %, more preferably 3 mol % or less.

In this preferred embodiment, it is preferable to add a phosphor having a luminescent center wavelength of 550 nm to 650 mu into the fluoride glass for increase of red component light as in the case of the broadband emission material. It is also preferable to add 0.01 to 2 mol % of at least one halide of element selected from the group consisting of Mn, Sm and Pr into the fluoride glass.

Another preferred embodiment of the present invention is a composite luminescent material formed by encapsulating either of the broadband emission material and the white light emission material (each also simply referred as "emission material") with an encapsulant material in the same manner as ordinary phosphors (see, for example, Patent Document 6). In other words, each of the broadband emission material and the white light emission material can preferably be used in the form of being dispersed in an encapsulant material.

There is no particular limitation on the encapsulant material. Examples of the encapsulant material are glass, silicon resin, epoxy resin, organic-inorganic hybrid composition and the like. These encapsulant materials may be used in the form of a mixture thereof.

In this preferred embodiment, the emission material is preferably added in an amount of 1 to 50 mass % as a phosphor to the encapsulant material. When the amount of the emission material added to the encapsulant material is less than 1 mass %, the composite luminescent material may fail to show a sufficient emission. When the amount of the emission material added to the encapsulant material exceeds 50 mass %, the uniform composite luminescent material may not be obtained by precipitation of the phosphor.

It is further preferable in this preferred embodiment to pulverize the emission material used as the phosphor to a median diameter D50 of 1 mm or smaller. If the median diameter D50 of the emission material exceeds 1 mm, there may be likely to occur precipitation of the emission material. As the lower limit of the median diameter D50 of the phosphor is generally of the order of 1 μm, the median diameter D50 of the emission material may be set larger than or equal to 1 μm. The composite luminescent material, in which the emission material is encapsulated as the phosphor, is capable of being excited by the use of a gallium nitride-based light source having a wavelength range of 190 nm to 450 nm.

In the present specification, the term "median diameter d50" refers to a particle size at 50% accumulation in a particle size distribution as measured by laser diffraction scattering method.

Still another preferred embodiment of the present invention is an optical waveguide formed by using either of the broadband emission material and the white light emission material as a core.

In the optical waveguide, the core may be circular or rectangular in cross section. Further, the optical waveguide may be formed with a double clad structure. In order to adjust the refractive index of the core, it is feasible to control the amounts of alkaline-earth and lanthanoid.

As a clad of the optical waveguide, there can be used any clad material that does not react with the core material and has moldability and practical transparency in both of excitation and emission wavelength ranges. Examples of the clad material are, not only Al-based fluoride glass equivalent in composition to that of the present invention, but also fluorophosphate salt glass, low-melting oxide glass, organic-inorganic hybrid glass and fluorine-containing resin material having high transparency even in an ultraviolet wavelength range.

In the case where the optical waveguide is formed as a fiber, it is preferable to use, as a first clad, Al-based fluoride glass that is in the same family as and relatively close in thermal properties to that of the present invention. A second clad of resin may be formed on the outer side of the first clad. Alternatively, a coating film of ordinary coating resin may be applied to the outer side of the first clad. In the case where the resin material is used as the clad, thermosetting resin is referred rather than ultraviolet curable resin.

In the case where the white light emission material of the present invention is used as a core in the planar optical waveguide or fiber, it is feasible to obtain single mode light of required wavelengths by appropriately setting the cutoff wavelength. For example, light of 550 nm to 750 nm wavelength can be selectively taken out as single mode light by winding the fiber of 550 nm cutoff wavelength several times around a diameter of 10 mm. This effect is also obtained in the same manner as above even in the case where a pigtail fiber is attached to the output side.

Yet another preferred embodiment of the present invention is a white light emitting device including the white light emission material as an amplifier, at least one excitation light source having a wavelength range of 190 nm to 450 nm, a coupling optical mechanism for coupling excitation light from the excitation light source to the white light emission material and an emission optical mechanism for outputting a light emission from the white light emission material.

In the white light emitting device, a discharge lamp, LED, LD etc. can be used as the excitation light source. In the case where beam quality such as beam convergence is important, it is feasible to use a harmonic of laser light. In particular, a harmonic laser such as semiconductor laser excitation solid laser (DPSSL) or Yb:fiber laser (YDFL) is useful because of high power at a single wavelength in ultraviolet to blue wavelength ranges.

As the coupling optical mechanism for coupling excitation light from the excitation, light source to the white light emission material, it is preferable to use a housing with a reflection mirror and converge the excitation light onto the white light emission material within the housing when the lamp such as discharge lamp is used as the excitation light source. When the LED or LD is used as the excitation light source, the coupling optical mechanism can be easily configured to excite the material from its end face by adjusting the laser beam at a location, very close to the optical output end. The harmonic laser such as DPSSL or YDFL is suitably usable as the excitation light source for end-face excitation of the optical waveguide with the white light emission material of the present invention because the laser beam of the harmonic laser can be converged to a small spot.

The white light obtained by the present invention can be divided into a plurality of wavelength bands or a plurality of supply lines by ordinary spectroscopic means or power split means. For example, it is feasible by the use of an optical part having an optical multilayer film with wavelength characteristics to take a specific wavelength component out of the white light, block a specific wavelength component of the white light or adjust the wavelength spectrum shape of the white light. Further, it is feasible to divide the white light into a plurality of optical paths by the use of power split means such as optical splitter.

EXAMPLES

The present invention will be described in more detail below by way of Examples and Comparative Example.

Comparative Example 1

Raw glass materials for samples No. 1 and No. 9 were prepared by using and mixing starting compounds at respective mol % as shown in TABLE 1. Each of the samples No. 1 and No. 9 was obtained by placing the raw glass material in a crucible of glassy carbon, melting the raw glass material in a reduced atmosphere (i.e. atmosphere of nitrogen gas containing 3 vol % of hydrogen gas) at 1000° C. for 1 hour and cooling the crucible with the glass melt on a copper block. The sample No. 9 was different from the sample No. 1 in that: the content amount of $BaF_2$ was changed to 0 mol %; and the content amount of $SrF_2$ was changed to 20 mol %.

Example 1

Samples No. 2 to No. 8 were obtained in the same manner as in Comparative Example 1 except for preparing raw glass materials by using and mixing starting compounds at respective mol % as shown in TABLE 1. The sample No. 2 was set to the same Ba cation content as the sample No. 1 by replacing a part of $BaF_2$ with $BaCl_2$, whereas the samples No. 3 to No. 8 were substantially free of Ba. More specifically, the samples No. 4 and No. 5 were different in composition from the sample No. 3 in that the Ca cation content was decreased with increase in the Sr cation content. The sample No. 6 was different in that $CaCl_2$ was used in place of $BaF_2$. The samples No. 7 and 8 were different in composition from the sample No. 3 in that the content amount of $YbF_3$ was increased.

TABLE 1

| No. | $AlF_3$ | $BaF_2$ | $SrF_2$ | $CaF_2$ | $MgF_2$ | $YF_3$ | $BaCl_2$ |
|---|---|---|---|---|---|---|---|
| 1 | 35 | 10 | 10 | 20 | 10 | 14.82 | |
| 2 | 35 | 5 | 10 | 20 | 10 | 14.82 | 5 |
| 3 | 35 | | 10 | 20 | 10 | 14.82 | |
| 4 | 35 | | 10 | 15 | 10 | 14.82 | |
| 5 | 35 | | 20 | 10 | 10 | 14.82 | |
| 6 | 35 | | 10 | 20 | 10 | 14.82 | |
| 7 | 35 | | 10 | 20 | 10 | 14.50 | |
| 8 | 35 | | 10 | 20 | 10 | 14.28 | |
| 9 | 35 | | 20 | 20 | 10 | 14.82 | |

| No. | $SrCl_2$ | $CaCl_2$ | $YbF_3$ | Internal quantum efficiency/External quantum efficiency |
|---|---|---|---|---|
| 1 | | | 0.18 | 4%/15% |
| 2 | | | 0.18 | 15%/26% |
| 3 | 10 | | 0.18 | 29%/37% |
| 4 | 15 | | 0.18 | 70%/74% |
| 5 | 10 | | 0.18 | 27%/36% |
| 6 | | 10 | 0.18 | 30%/38% |
| 7 | 10 | | 0.50 | 28%/35% |
| 8 | 10 | | 0.72 | 20%/31% |
| 9 | | | 0.18 | 5%/15% |

[Measurement of Emission Spectra and Excitation Spectra]

Emission and excitation spectra of the above-obtained samples were measured as follows by the use of a spectrophotofluorometer (FP6500 available from JASCO Corporation).

[Measurement of Emission Spectra]

The emission spectra of the sample No. 1 (Comparative Example 1) according to conventional composition and of the samples No. 2 to No. 4 (Example 1) according to the present invention were measured at an excitation wavelength of 365 nm. The measured emission spectra are shown in FIG. 1 (samples No. 1 to No. 3) and FIG. 4 (sample No. 4 along with sample No. 3 for comparison).

As compared to the emission spectrum of the sample No. 1, the emission spectrum of the sample No. 2 showed an increase in intensity over an entire wavelength range of 400 to 700 nm as shown in FIG. 1. The emission spectrum of the sample No. 3 was twice or more higher in intensity than the emission spectrum of the sample No. 1.

Figure 2:
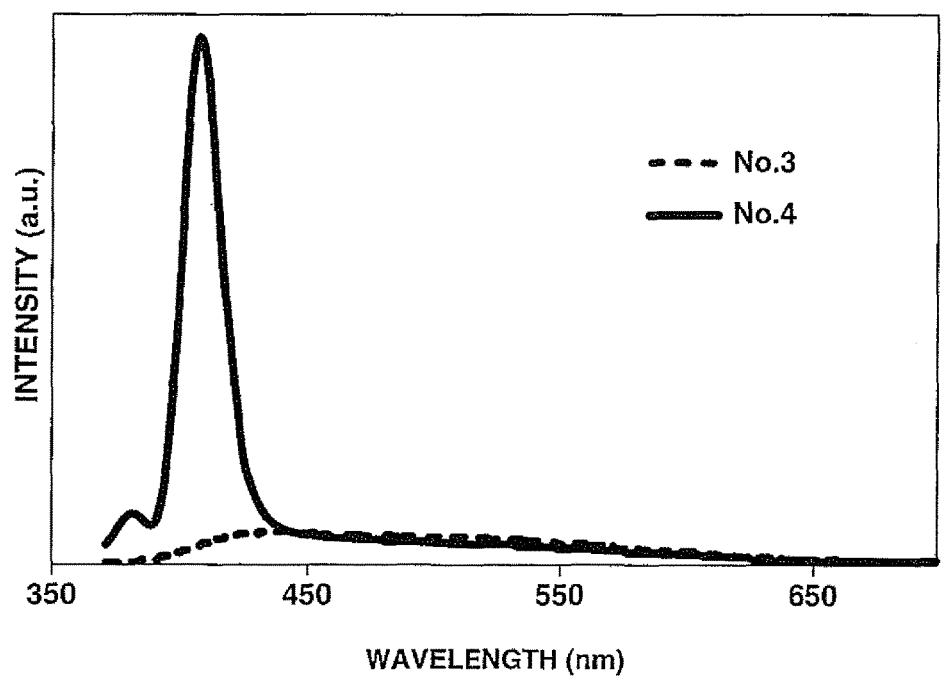
FIG. 2 is a diagram showing emission spectra of samples No. 3 and No. 4 as measured at an excitation wavelength of 365 nm.

As shown in FIG. 2, the emission spectrum of the sample No. 4 had a significantly increased peak in the vicinity of a wavelength of 410 nm so that the emission color was purple white rather than white.

[Measurement of Excitation Spectra]

The excitation spectra of the samples No. 1 to No. 3 were measured at an excitation wavelength of 520 nm. The measured excitation spectra are shown in FIG. 3.

Figure 3:
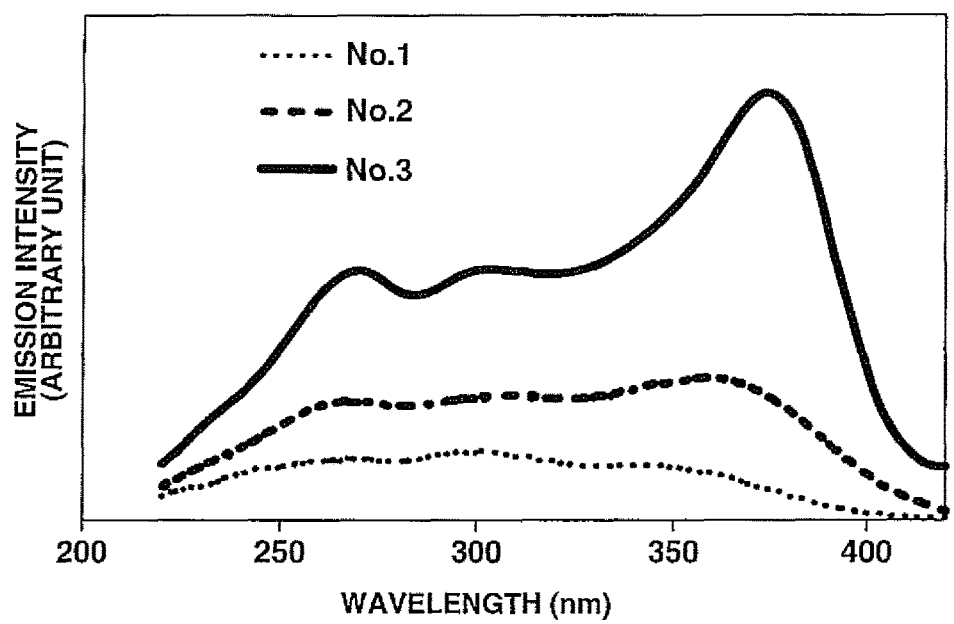
FIG. 3 is a diagram showing excitation spectra of samples No. 1 to No. 3 as measured at an emission wavelength of 520 nm.

As shown in FIG. 3, the excitation spectra of the samples No. 2 and No. 3 were increased in intensity in a wavelength band of 350 to 400 nm. It mean that both of the samples No. 2 and No. 3 was efficiently exited in this wavelength band. It has thus been shown that it is possible to use a GaN-based semiconductor laser, which has a high electrical-to-optical conversion efficiency, as an excitation light source because the vicinity of a wavelength of 365 nm corresponds to the band gap of GaN.

[Determination of $Yb^{2+}$ Content]

The content of $Yb^{2+}$ as the luminescent center in each of the samples No. 3, No. 7 and No. 8 was determined as follows. Two kinds of glasses were prepared for each sample by melting the raw glass material in a reduced atmosphere as mentioned above and in an oxidizing atmosphere (i.e. atmosphere of nitrogen gas containing 0.5% of chlorine gas). The prepared glasses were subjected to double-sided polishing and thereby adjusted to the same thickness (6 mm). The transmittance of these glasses was measured at a 972-nm band, where $Yb^{3+}$ shows emission, by the use of a spectrophotometer (U4100 available from Hitachi Ltd.). By comparison of the measured transmittance values, the amount of decrease of $Yb^{3+}$ (i.e. the amount of $Yb^{2+}$ generated) was determined.

The $Yb^{2+}$ content of the samples No. 3, No. 7 and No. 8 were 1500 wt ppm, 5000 wt ppm and 6000 wt ppm, respectively.

[Evaluation of of Quantum Efficiencies]

The internal and external quantum efficiencies of the samples No. 1 to No. 9 were evaluated. The evaluation results are shown in TABLE 1. The evaluation of the internal and external quantum efficiencies was carried out according to the method as described in Non-Patent Document 4 by measuring excitation and fluorescence spectra of each sample by the use of a spectrophotofluorometer (FP6500 available from JASCO Corporation) with an integrating sphere (ILF-533 available from JASCO Corporation). The internal quantum efficiency and the external quantum efficiency were determined as C/A and C/B, respectively, with the proviso that, in the excitation and fluorescence spectra. A was the integrated intensity of excitation light incident to the integrating sphere; B was the integrated intensity of excitation light absorbed by the sample; and C was the integrated intensity of fluorescence emitted from the sample, The higher the values of the internal and external quantum efficiencies, the higher the emission efficiency. As shown in TABLE 1, the samples No. 2 to No. 8 were higher in emission efficiency than the samples No. 1 and 9. On the other hand, the quantum efficiencies of the Cl-free samples No. 1 and No. 9 were at the same level. It is thus apparent that there arises no change of emission efficiency only by decrease in the Ba content of the glass composition.

As is seen from comparison of the samples No. 1 and No. 2, which were the same in Ba content but had different content amounts of $BaCl_2$, the addition of $BaCl_2$ led to an increase of quantum efficiency. The quantum efficiencies of the samples No. 3 and No. 5, which had different content amounts of $SrF_2$ and $CaF_2$, were at the same level. The quantum efficiencies of the samples No. 3 and No. 6, which had different content amounts of $SrCl_2$ and $CaCl_2$, were at the same level. The quantum efficiencies of the samples No. 3, No. 5 and No. 6, each of which had a higher chloride than the sample No. 2 were higher than those of the sample No. 2. The quantum efficiencies of the sample No. 4, which had a still higher chloride content, were higher than those of the samples No. 3, No. 5 and No. 6.

It has been shown by the above results that it is possible to achieve the high emission efficiency of the emission material by increasing the content amount of the chloride in the glass composition.

As is seen from comparison of the quantum efficiencies of the samples No. 7 and No. 8, which were different in $Yb^{2+}$ content, the emission efficiency of the sample No. 7 was higher than that of the sample No. 8. The reason for this is assumed to be the influence of concentration quenching. It has thus been shown that the $Yb^{2+}$ content of the glass composition is preferably 5000 mass ppm or less.

Comparative Example 2

Samples No. 10 to No. 13 were obtained in the same manner as in Comparative Example 1 except for preparing raw glass materials by using and mixing starting compounds at respective mol % as shown in TABLE 2.

TABLE 2

| No. | $AlF_3$ | $BaF_2$ | $SrF_2$ | $CaF_2$ | $MgF_2$ | $YF_3$ | $BaCl_2$ | $SrCl_2$ | $CaCl_2$ | $P_2O_5$ | $YbF_3$ |
|---|---|---|---|---|---|---|---|---|---|---|---|
| 10 | 35 | 9 | 10 | 20 | 10 | 14.8 | 1 | | | | 0.2 |
| 11 | 34 | 9 | 10 | 20 | 10 | 14.8 | 1 | | | 1 | 0.2 |
| 12 | 30 | 9 | 10 | 20 | 10 | 14.8 | 1 | | | 5 | 0.2 |
| 13 | 25 | 9 | 10 | 20 | 10 | 14.8 | 1 | | | 10 | 0.2 |

Figure 4:
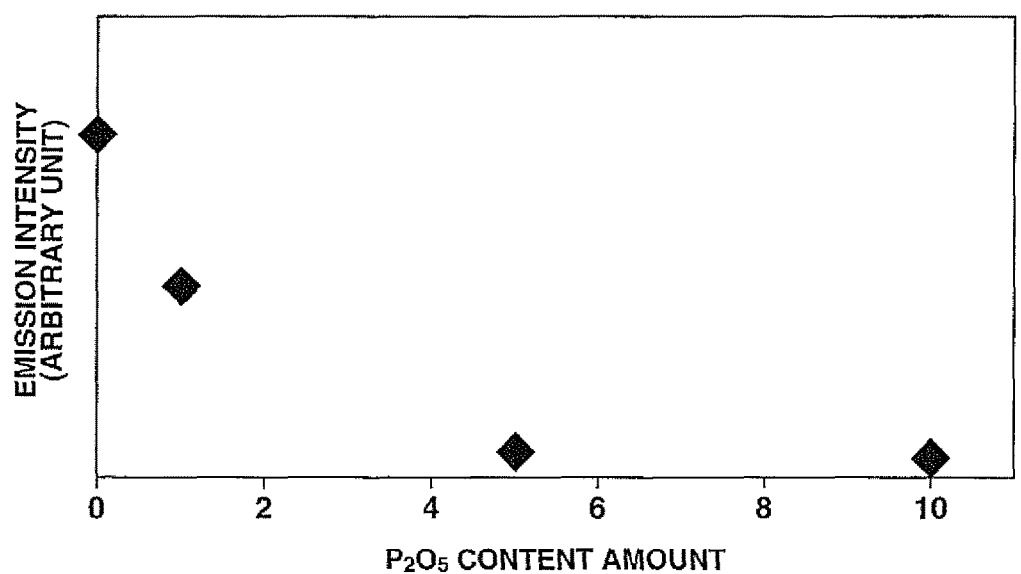
FIG. 4 is a schematic diagram showing the emission intensities of emission spectra of samples No. 10 to No. 13 as measured at an excitation wavelength of 365 nm.

Emission spectra of the thus-obtained samples No. 10 to No1.3 were measured at an excitation wavelength of 365 nm in the same manner as those of the samples No. 1 to No. 4. The emission intensity of the emission spectra of the respective samples are shown in FIG. 4 assuming the emission intensity of the $P_2O_5$-free sample No. 10 as 100 on the vertical axis. As is seen from FIG. 4, the emission intensity was decreased with increase in the content amount of $P_2O_5$. The amount of decrease of the emission intensity with respect to its original value was about 50% when the content amount of $P_2O_5$ was 1 mol %. It has thus been shown that the content amount of $P_2O_5$ is preferably 1 mol % or less.

Example 2

As mentioned above, the emission color of the sample No. 4 was purple white. A sintered body was produced as follows by adding a red phosphor to the sample No. 4 for color correction.

First, the sample No. 4 was pulverized to a powder with an average particle size of 10 μm in a nitrogen atmosphere. As the red phosphor, $Eu^{2+}$:$CaAlSiN_3$ (luminescent center wavelength: 630 nm, average particle size: 10 μm) was added in an amount of 2 wt % based on the total weight of the powder of the sample No. 4. The powder of the sample No. 4 was mixed well with the red phosphor. The resulting mixture was formed into a pellet with a diameter of 12 mm and a thickness of 0.5 mm. The pellet was sintered by heating at 430° C. for 1 minute in a nitrogen atmosphere. By this, the sintered body in which the red phosphor was mixed in the sample No. 4 was completed as a test sample.

Figure 5:
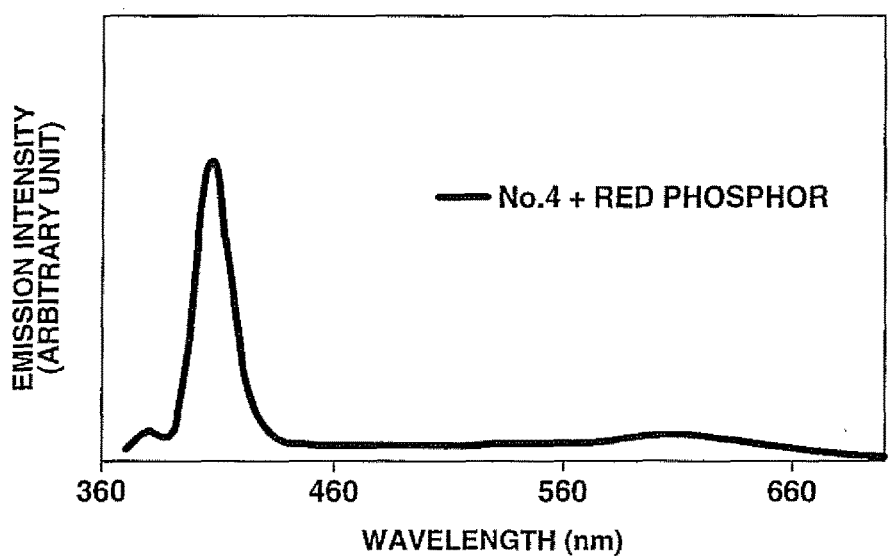
FIG. 5 is a diagram showing an emission spectrum of a sample of Example 2 as measured at an excitation wavelength of 365 nm.

An emission spectrum of the thus-obtained test sample was measured at an excitation wavelength of 365 nm. The measured emission spectrum is shown in TABLE 5. As shown in FIG. 5, there occurred an increase of emission component in the vicinity of a wavelength of 630 nm by the addition of the red phosphor. As a result, the emission color was changed from purple white to be close to white.

Example 3

A fiber was produced as follows. A core of the fiber was of $AlF_3$-based fluoride glass into which 1500 wt ppm of divalent ytterbium ions ($Yb^{2+}$) and 0.3 mass % of trivalent ytterbium ions ($Yb^{3+}$) were added as rare-earth ions. A clad of the fiber was of $AlF_3$-based fluoride glass.

The composition of the $AlF_3$-based fluoride glass used is indicated below. In the composition, the numerals represent mol % of the respective fluorides. Further, the term "LnF" refers to the sum of the rare-earth trifluorides, including $YbF_3$ and $YF_3$, in the composition. The $AlF_3$-based fluoride glass of the core was subjected to reduction to a predetermined reduction rate by flowing 112 into the atmospheric gas during the melting. (Core) $ALF_3$: 35, $LnF_3$: 15, $MgF_2$: 10, $CaF_2$: 17.5, $SrF_2$: 13, $SrCl_2$: 7, $BaCl_2$: 2.5

Figure 6:
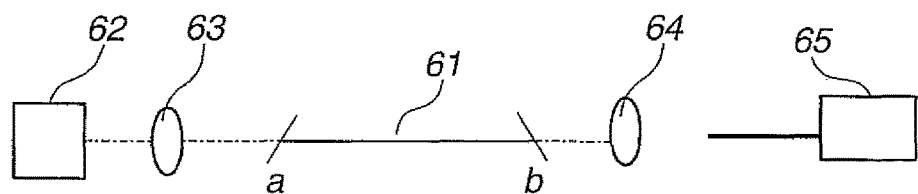
FIG. 6 is a schematic view of a device used for emission measurement of a fiber of Example 3.

The composition of the clad was controlled such that thus-obtained fiber had an NA of 0.15 and a cutoff wavelength of 780 nm. The fiber was 5 cm in length. The emission spectrum of this fiber was measured using a device shown in FIG. 6.

In the device, a GaN laser 63 was used as an excitation light source to emit ultraviolet light of 375 nm wavelength. The light emitted from the GaN laser 63 was converged onto one end a of the fiber 61 by an aspheric lens 62 (NA: 0.66). It is noted that both end faces of the fiber 61 were polished obliquely at 8 degrees so as to suppress return light.

The light emitted from the other end b of the fiber 61 was introduced to a light receiving portion of a multichannel spectrometer 65 (PMA-11 available from Hamamatsu Photonics K.K.) by an aspheric lens 64 (NA: 0.40). The occurrence of white emission was measured by this spectrometer.

Figure 7:
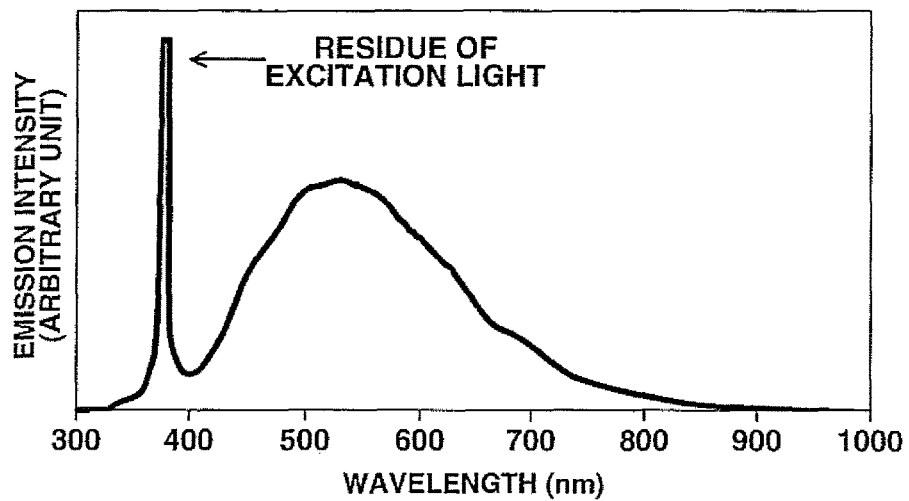
FIG. 7 is a diagram showing an emission spectrum of the fiber of Example 3.

The measured emission spectrum is shown in FIG. 7. As shown in FIG. 7, the occurrence of strong white emission of $Yb^{2+}$ was confirmed. Herein, a 375-nm wavelength peak in the emission spectrum was attributed to a component of the excitation light remaining without being absorbed by the fiber, not attributed to the emission of $Yb^{2+}$, It has been shown by this result that it is possible to, even when the emission material was in fiber form, attain white emission from the emission.

Example 4

Samples No. 14 to No. 16 were obtained in the same manner as in Comparative Example 1 except for preparing raw glass materials by using and mixing starting compounds at respective mol % as shown in TABLE 3.

TABLE 3

| No. | AlF$_3$ | SrF$_2$ | CaF$_2$ | MgF$_2$ | YF$_3$ | SrCl$_2$ | MnF$_2$ | YbF$_3$ |
|---|---|---|---|---|---|---|---|---|
| 14 | 35 | 10 | 20 | 9.95 | 14.82 | 10 | 0.05 | 0.18 |
| 15 | 35 | 10 | 20 | 9.90 | 14.82 | 10 | 0.10 | 0.18 |
| 16 | 35 | 10 | 20 | 9 | 14.82 | 10 | 1 | 0.18 |

The thus-obtained samples were tested for emission by excitation at wavelength of 360 nm. The emission color of the sample No. 14, which was close in glass composition to the sample No. 3, was more natural white than that of the sample No. 3. The emission color of the sample No. 15 was pink. The emission color of the sample No. 16 was also pink. Although there occurred devitrification of the sample No. 16 by crystallization, the degree of devitrification of the sample was at a level with no problem for practical use.

Figure 8:
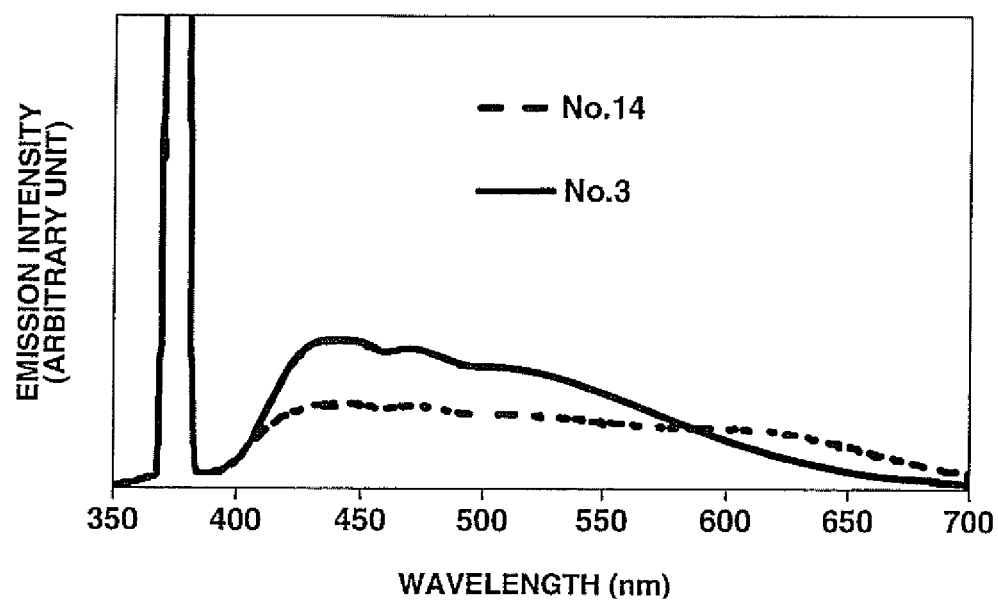
FIG. 8 is a diagram showing an emission spectrum of a sample of Example 4.

The emission spectra of the samples No. 3 and No. 14 were measured by the use of a spectrophotofluorometer (FP6500 available from JASCO Corporation). The measured emission spectra are shown in FIG. 8. The measurement of the emission spectra was done at an excitation wavelength of 365 nm. As is apparent from FIG. 8, the addition of MnF$_2$ to the glass composition led to an decrease of blur blue component light and an increase of red component light. The emission spectrum of the sample No. 14 was more flattened than that of the sample No. 3. It has thus been shown that it is possible to achieve the higher color-rendering properties of the white light emission material by the addition of MnF$_2$.

Example 5

The sample No. 3 of TABLE 1 was pulverized to a median diameter D50 of about 50 μm by the use of a jet mill (SJ-100 available from Nisshin Engineering Inc.), thereby yielding a powder of emission material. The thus-yielded powder was mixed at a rate of 5 mass % with a silicone resin (SCR-1011 (A/B) available from Shin-Etsu Chemical Co., Ltd.). The resulting mixture was cured by heating at about 150° C. for 5 hours.

When the thus-obtained cured body was placed on an ultraviolet LED (NC4U134 available from Nichia Corporation, center wavelength: 385 nm), there occurred white emission from the cured body. It has been shown by this result that it is possible to mount the white light emission material on a light emitting device by pulverizing the white light emission material and encapsulating the white light emission material in a resin or glass material.

DESCRIPTION OF REFERENCE NUMERALS

61: Fiber
62: Aspheric lens
63: Excitation light source
64: Aspheric lens
65: Multichannel spectrometer

The invention claimed is:

1. A broadband emission material comprising:
a fluoride glass containing 20 to 45 mol % of AlF$_3$, 25 to 63 mol % of alkaline-earth fluorides in total and 3 to 25 mol % of at least one fluoride of an element selected from the group consisting of Y, La, Gd and Lu; and
ytterbium ions incorporated in the fluoride glass as divalent rare-earth ions so as to serve as a luminescent center,
wherein the fluoride glass includes 1 to 15 mol % of at least one halide of an element selected from the group consisting of Al, Ba, Sr, Ca and Mg and an element selected from the group consisting of Cl, Br and I; and
wherein the alkaline-earth fluorides includes 0 to 15 mol % of MgF$_2$, 7 to 25 mol % of CaF$_2$, 0 to 22 mol % of SrF$_2$ and 0 to 2 mol % of BaF$_2$.

2. The broadband emission material according to claim 1, wherein the total amount of a phosphorus compound in the fluoride glass is 1 mol % or less.

3. A composite luminescent material comprising: an encapsulant material; and the broadband emission material according to claim 1 being dispersed in the encapsulant material.

4. An optical waveguide comprising the broadband emission material according to claim 1 as a core.

5. A white light emission material comprising: the broadband emission material according to claim 1; and a phosphor having a luminescent center wavelength of 550 nm to 650 nm and being incorporated in the fluoride glass.

6. A white light emission material comprising:
a broadband emission material including:
a fluoride lass containing 20 to 45 mol % of AlF$_3$, 25 to 63 mol % of alkaline-earth fluorides in total and 3 to 25 mol % of at least one fluoride of an element selected from the group consisting of Y, La, Gd and Lu; and
ytterbium ions incorporated in the fluoride glass as divalent rare-earth ions so as to serve as a luminescent center,
the fluoride glass including 1 to 15 mol % of at least one halide of an element selected from the group consisting of Al, Ba, Sr, Ca and Mg and an element selected from the group consisting of Cl, Br and I,
the alkaline-earth fluorides including 0 to 15 mol % of MgF$_2$, 7 to 25 mol % of CaF$_2$, 0 to 22 mol % of SrF$_2$ and 0 to 5 mol % of BaF$_2$; and
0.01 to 2 mol % of at least one halide of an element selected from the group consisting of Mn, Sm and Pr being incorporated in the fluoride glass.

7. The white light glass emission material according to claim 6, further comprising a phosphor having a luminescent center wavelength of 550 nm to 650 nm and being incorporated in the fluoride glass.

8. A white light glass emission material comprising:
a broadband emission material including:
a fluoride lass containing 20 to 45 mol % of AlF$_3$, 25 to 63 mol % of alkaline-earth fluorides in total and 3 to 25 mol % of at least one fluoride of an element selected from the group consisting of Y, La, Gd and Lu; and
ytterbium ions incorporated in the fluoride glass as divalent rare-earth ions so as to serve as a luminescent center,
wherein the fluoride glass includes 1 to 15 mol % of at least one halide of an element selected from the group consisting of Al, Ba, Sr, Ca and Mg and an element selected from the group consisting of Cl, Br and I;
wherein the alkaline-earth fluorides includes 0 to 15 mol % of MgF$_2$, 7 to 25 mol % of CaF$_2$, 0 to 22 mol % of SrF$_2$ and 0 to 5 mol % of BaF$_2$; and
wherein the total amount of Ba cations contained in the fluoride glass is 0 to 5 mol %.

9. The white light glass emission material according to claim 8, further comprising 0.01 to 2 mol % of at least one halide of element selected from the group consisting of Mn, Sm and Pr being incorporated in the fluoride glass.

10. The white light glass emission material according to claim 8, further comprising a phosphor having a luminescent center wavelength of 550 nm to 650 nm and being incorporated in the fluoride glass.

11. A composite luminescent material comprising: an encapsulant material; and the white light emission material according to claim 5 being dispersed in the encapsulant material.

12. An optical waveguide comprising the white light emission material according to claim 5 as a core.

13. A white light emitting device, comprising:
the white light emission material according to claim 5 as an amplifier;
at least one excitation light source having a wavelength range of 190 nm to 450 nm;
a coupling optical mechanism for coupling excitation light from the excitation light source to the white light emission material; and
an emission optical mechanism for outputting a light emission from the white light emission material.

14. A composite luminescent material comprising: an encapsulant material; and the white light emission material according to claim 6 being dispersed in the encapsulant material.

15. An optical waveguide comprising the white light emission material according to claim 6 as a core.

16. A white light emitting device, comprising:
the white light emission material according to claim 6 as an amplifier;
at least one excitation light source having a wavelength range of 190 nm to 450 nm;
a coupling optical mechanism for coupling excitation light from the excitation light source to the white light emission material; and
an emission optical mechanism for outputting a light emission from the white light emission material.

17. A composite luminescent material comprising: a sealing material; and the white light emission material according to claim 8 being dispersed in the sealing material.

18. An optical waveguide comprising the white light emission material according to claim 8 as a core.

19. A white light emitting device, comprising:
the white light emission material according to claim 8 as an amplifier;
at least one excitation light source having a wavelength range of 190 nm to 450 nm;
a coupling optical mechanism for coupling excitation light from the excitation light source to the white light emission material; and
an emission optical mechanism for outputting a light emission from the white light emission material.

* * * * *